US 6,649,452 B2

(12) United States Patent
Lucas et al.

(10) Patent No.: US 6,649,452 B2
(45) Date of Patent: Nov. 18, 2003

(54) METHOD FOR MANUFACTURING A LITHOGRAPHIC RETICLE FOR TRANSFERRING AN INTEGRATED CIRCUIT DESIGN TO A SEMICONDUCTOR WAFER

(75) Inventors: Kevin D. Lucas, Austin, TX (US); William L. Wilkinson, Georgetown, TX (US); Cesar Garza, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/085,960

(22) Filed: Feb. 28, 2002

(65) Prior Publication Data

US 2003/0162329 A1 Aug. 28, 2003

(51) Int. Cl.[7] ............................................. H01L 21/82
(52) U.S. Cl. ........................................... 438/129; 430/5
(58) Field of Search ................................ 716/6; 438/129

(56) References Cited

U.S. PATENT DOCUMENTS

| | | | | |
|---|---|---|---|---|
| 5,821,014 A | * | 10/1998 | Chen et al. | 430/5 |
| 5,827,625 A | * | 10/1998 | Lucas et al. | 430/5 |
| 5,879,844 A | | 3/1999 | Yamamoto et al. | |
| 5,881,125 A | * | 3/1999 | Dao | 378/35 |
| 5,885,856 A | | 3/1999 | Gilbert et al. | |
| 5,900,340 A | * | 5/1999 | Reich et al. | 430/22 |
| 5,958,635 A | * | 9/1999 | Reich et al. | 430/30 |
| 6,022,644 A | | 2/2000 | Lin et al. | |
| 6,042,973 A | | 3/2000 | Pierrat | |
| 6,063,530 A | * | 5/2000 | Grassmann | 430/30 |
| 6,077,630 A | | 6/2000 | Pierrat | |
| 6,139,994 A | | 10/2000 | Broeke et al. | |
| 6,268,091 B1 | | 7/2001 | Pierrat | |
| 6,368,762 B1 | * | 4/2002 | Ling | 430/30 |
| 6,410,191 B1 | * | 6/2002 | Nistler et al. | 430/5 |

FOREIGN PATENT DOCUMENTS

| EP | 0293643 A2 | 12/1988 |
|---|---|---|
| EP | 0293643 B1 | 12/1988 |

OTHER PUBLICATIONS

T. Schiml et al., "A 0.13μm CMOS Platform with Cu/Low–k Interconnects for System On Chip Applications", 2001 IEEE Symposium on VLSI Technology Digest of Technical Papers, Infineon, Jun. 13, 2001 Session 8B, Paper 1, 2 pgs.

* cited by examiner

Primary Examiner—David Nelms
Assistant Examiner—Thao P Le
(74) Attorney, Agent, or Firm—Kim-Marie Vo; Daniel D. Hill

(57) ABSTRACT

A lithographic reticle with subresolution features in the design-pattern is used to control critical dimensions in a semiconductor manufacturing process. After the location of design and processing features is determined, subresolution features are formed in areas devoid of design and processing features. The subresolution features can substantially fill all of the area devoid of design processing features or, instead, selectively fill portions of the area. In one embodiment, the width of the area devoid of design and processing features is less than two times the width of a feature. The presence of the subresolution features results in improved control of small dimensions of features in semiconductor processing, thereby increasing yield and device performance.

14 Claims, 3 Drawing Sheets

METHOD FOR MANUFACTURING A LITHOGRAPHIC RETICLE FOR TRANSFERRING AN INTEGRATED CIRCUIT DESIGN TO A SEMICONDUCTOR WAFER

FIELD OF THE INVENTION

The field of the invention relates generally to semiconductor devices, and more specifically, to reticles used to form semiconductor devices.

RELATED ART

As semiconductor device dimensions shrink, semiconductor device feature density increases. Thus, physical dimensions of features and spaces between the features decrease. Since the spaces between the features are smaller, if the decreased features' physical dimensions are not well controlled adjacent features may merge. If the features are conductive, they will short together. Alternatively, the features can be smaller than desired and thus not perform as required. For example, a feature can be too small to provide enough current to another feature. Thus, in order for the semiconductor device to function properly the physical dimensions of the features must be well controlled.

In order to measure the control of the physical dimensions, the width of a feature, typically the smallest feature, is monitored through the manufacturing process. This measurement is termed critical dimension (CD).

The CD of a feature can be altered during reticle manufacturing, which impacts the resulting CD on the semiconductor wafer and often decreases manufacturing yield, circuit performance or device reliability. In other words, the CD of a feature during reticle manufacturing can have an adverse effect on the cost and/or performance of the semiconductor device. Thus, a need exists to control the CD of features during the reticle manufacturing process.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Since defects on a reticle can create defects in patterned layers formed over a semiconductor wafer, a CD (critical dimension) of features on a semiconductor wafer can be enhanced by improving the CD of patterns on a reticle. To improve CD control of the reticle, subresolution features can be formed in a semiconductor device design (integrated circuit design) of the reticle and be used to affect a transferred pattern formed on the reticle resulting from the semiconductor device design. However, the subresolution features are not present in the transferred pattern, since subresolution features are features that have dimensions that are not resolvable by a desired apparatus, such as a lithographic tool. Therefore, the subresolution features are not formed on the semiconductor wafer, but the semiconductor wafer has improved CD control.

The dimensions described herein are the dimensions of all features on the reticle, unless otherwise stated. Typically, the dimensions of the features on the reticle are 4 times larger than that of the patterned features on the semiconductor wafer. Therefore, if a dimension is stated herein as 400 nm, the dimension is 400 nm on the reticle and 100 nm on the semiconductor wafer.

Figure 1:
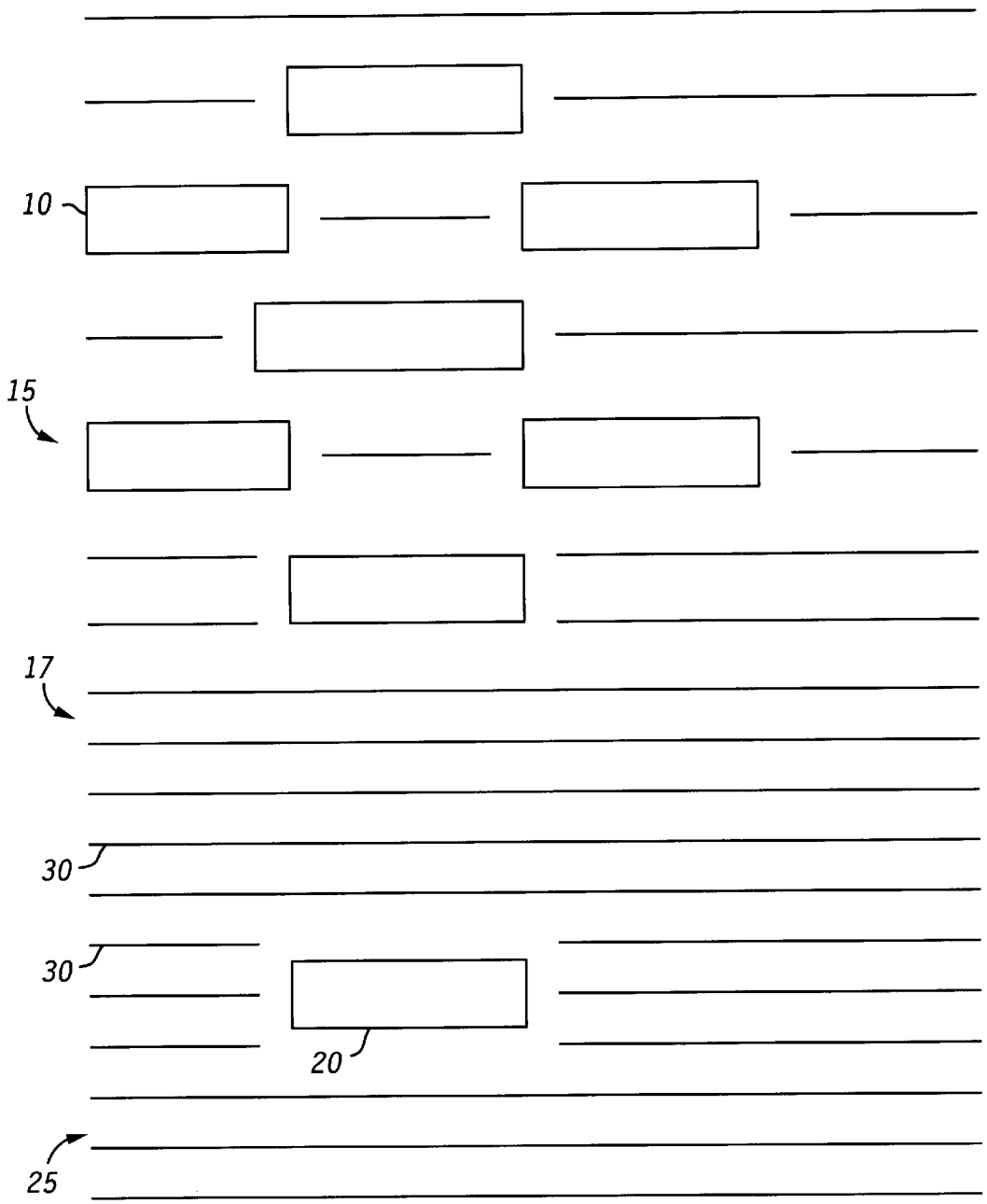
FIG. 1 illustrates a top-view of a portion of a first semiconductor design in accordance with one embodiment of the present invention.

Shown in FIG. 1 is a semiconductor device design 5 with an isolated region 25 and a dense region 15 separated by a region 17 devoid of design features. In one embodiment, the width of the region 17 that is devoid of design features is less than two times a width, preferably a minimum width, of one of the design features. In a preferred embodiment, the width of the region 17 is approximately ½ to 2 times a minimum width of the design feature.

In the embodiment shown in FIG. 1, the three regions 25, 15 and 17 are fully populated with subresolution features 30 or, more specifically, reticle subresolution features or subresolution design features 30. The isolated region 25 includes the reticle subresolution features 30 and an isolated feature 20, which is a design or pattern feature. As used herein a design or pattern feature is any feature other than a reticle subresolution feature 30. For example, the design feature can be an interconnect, a gate electrode, a well region, or any other feature that is not a reticle subresolution feature 30.

The dense region 15 includes the reticle subresolution features 30 and dense features 10, which can be any design feature and may be the same design feature as the isolated features 20. The dense features 10 are densely packed so that they are closer to each other than the isolated feature 20 is to any design features. For example, the dense features 10 are approximately 500–1500 nm apart from each other and the isolated feature 20 is greater than or equal to approximately 2000 nm away from any feature other than the reticle subresolution features 30.

The reticle subresolution features 30 are features that are drawn in the semiconductor device design 5 but are not resolved on the reticle. In other words, the reticle subresolution features 30 have at least one dimension (width or length) that is less than dimensions that a reticle patterning apparatus can resolve or transmit to a reticle substrate. In one embodiment, the reticle subresolution features 30 may have at least one dimension that is approximately ¼ to ⅔ of the dimensions that a reticle patterning apparatus can resolve. The spacing between the reticle subresolution features 30 and either the isolated feature 20 or dense features 10 may be approximately ½–2 times the dimensions that a reticle patterning apparatus can resolve. In an embodiment using optical laser technology, the reticle subresolution features 30 are approximately 40–120 nm in width and are approximately 100–400 nm away from the isolated feature 20 or each dense feature 10. In another embodiment, the length of the subresolution design features 30 are determined by the width of the region 17 devoid of design features. For example, the length of the subresolution design features 30 is approximately equal to the width of the region 17 devoid of design features.

In one embodiment, the reticle subresolution features 30 impact an illumination pattern of the photoresist on the reticle that can in turn impact the amount of acid generated within the photoresist being illuminated, resulting in improved control of the pattern features' CDs on a semiconductor wafer. In this embodiment, the reticle subresolution features 30 are not desired on the reticle or the semiconductor wafer and instead are used to control CDs of desired features on the semiconductor wafer, such as the isolated feature 20 and the dense features 10. In another embodiment, the reticle subresolution features may be located a predetermined distance from an edge of the pattern feature and compensate for undesirable edge or proximity effects, such as non-uniform radiation exposure. Additionally, the reticle subresolution features 30 can be placed near the edge of features that otherwise are distorted due to an asymmetric beam during an optical laser process to form a reticle. The asymmetry of the beam is exaggerated by the beam modulation at a corner of a feature, if no subresolution features 30 are present.

The locations of the reticle subresolution features 30 on the semiconductor device design 5 can be chosen by locating all design features and regions 17 that are devoid of design features, and adding the reticle subresolution features 30 to regions 17 devoid of design features in the semiconductor design 5. Any reticle subresolution feature 30 or portion of the reticle subresolution feature 30 that is undesirably too close, which in one embodiment is less than approximately ½ to 2 times the minimum dimension that a reticle patterning apparatus can resolve, to the isolated feature 20 or the dense features 10 is subsequently removed. This can be performed manually or be implemented in software on a data processing system. Additionally, any tiling or waffling software, design rule check (DRC) software, optical proximity correction (OPC) software, or the like can be used to place the reticle subresolution features 30 in the semiconductor device design 5.

Figure 2:
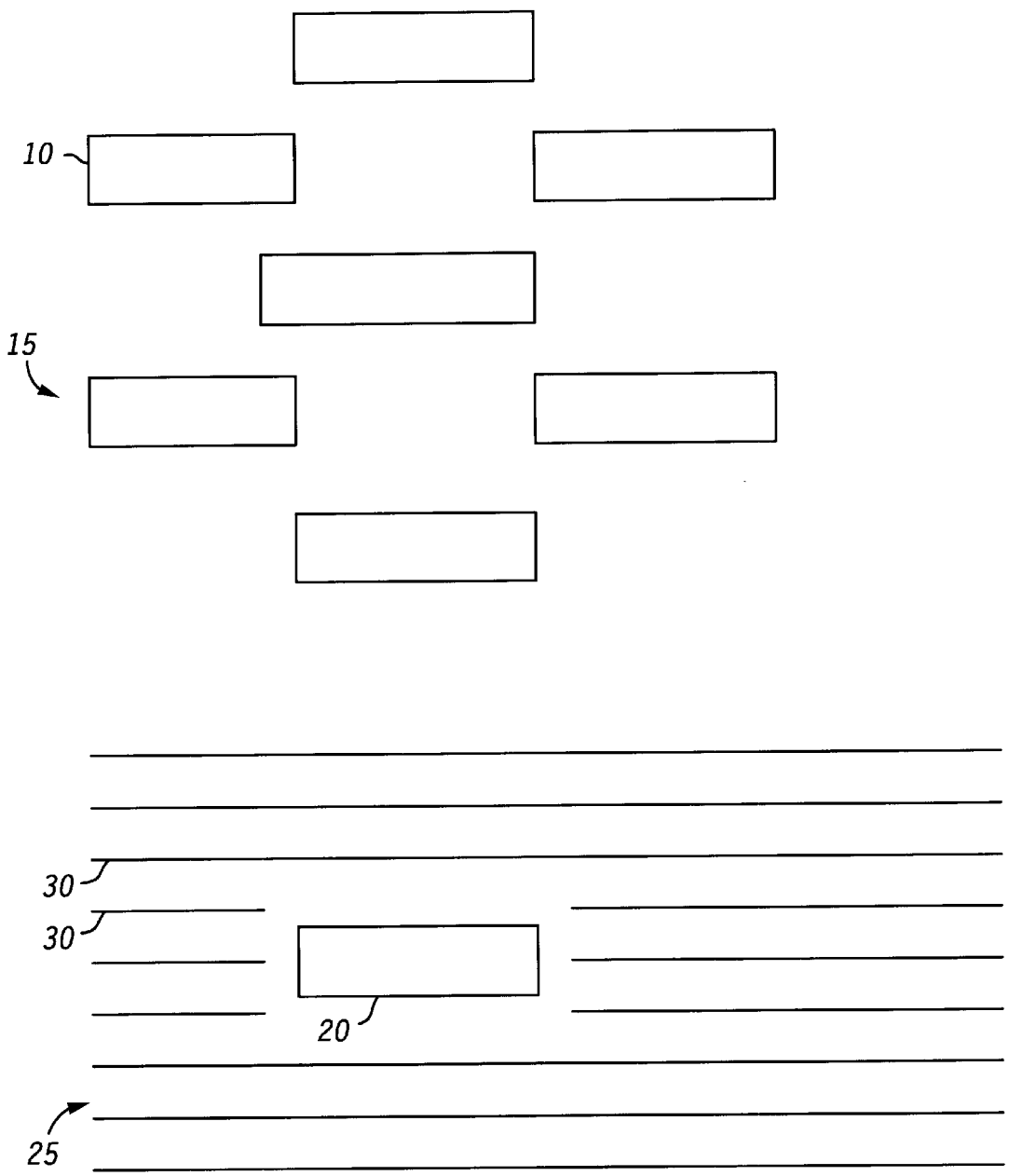
FIG. 2 illustrates a top-view of a portion of a second semiconductor design in accordance with another embodiment of the present invention.

Shown in FIG. 2 is an alternate embodiment of the reticle subresolution features 30 on the semiconductor device design, where the reticle subresolution features 30 surround the isolated feature 20, but the dense features 10 are substantially devoid of surrounding reticle subresolution features 30. This embodiment is particularly useful if there is a desire to control and/or alter the isolated feature's 20 CD, but not that of the dense features 10.

Although depicted in FIGS. 1–2 as rectangles parallel to the isolated feature 20 and the dense features 10, the reticle subresolution features 30 can be any shape and be perpendicular or at any other angle to the isolated feature 20 and the dense features 10. Alternatively, any number of rows of the reticle subresolution features 30 can be formed. For example, only three rows may be formed around the isolated feature 20. The number of rows present is a tradeoff between the desire for a smaller semiconductor design file size and the need for multiple rows to alter proximity effects. Additionally, any shape other than those shown for the isolated feature 20 and the dense features 10 may benefit from the presence of subresolution features 30. Although the subresolution features 30 in FIGS. 1 and 2 are shown between isolated features 20 and dense features 10, the subresolution features 30 can be between any features, such as between two isolated features 20.

A skilled artisan should recognize that the placement of the subresolution features 30 on a reticle might be different in different areas of the reticle. For example, if a large CD variation is problematic in the center of the reticle, then a higher density of the subresolution features 30 may be located near the center of the reticle than towards the edges of the reticle.

Figure 3:
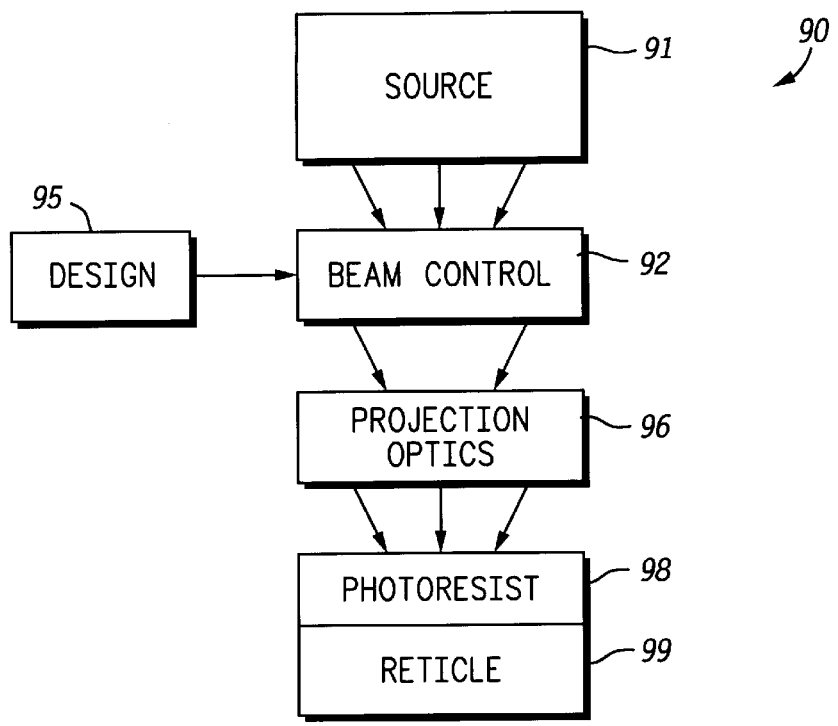
FIG. 3 illustrates a reticle patterning apparatus to form a reticle using a semiconductor design in accordance with the present invention.

Shown in FIG. 3 is a reticle patterning apparatus 90 which can be utilized in forming a reticle 99 having reticle subresolution features 30. The reticle patterning apparatus 90 comprises a source 91, a beam control 92, a design input 95, projection optics 96, and the reticle 99 having an overlying photoresist layer 98. The beam control 92 receives light or an E-beam generated from the source 91 and modulates the beam based upon the design input 95 to define features, including the design features and the reticle subresolution features 30, to be formed on the reticle 99. In one embodiment, the design input 95 is software on a data processing system. The projection optics 96 focus the light or E-beam on the photoresist 98 so that the photoresist 98 is selectively exposed according to a pattern representing the design input 95 and a photoresist pattern is made within the photoresist 98. Since the reticle subresolution features 30 are not resolvable by the projection reticle patterning apparatus 90, only the design features and any other features other than the reticle subresolution features 30 are formed in the photoresist pattern. Processing is performed to transfer the photoresist pattern from the photoresist 95 to the reticle 99 to form the transferred pattern in the reticle 99. Since the photoresist pattern does not have any reticle subresolution features 30, the transferred pattern has no reticle subresolution features 30. However, the reticle subresolution features 30 effect the light or E-beam so that the resulting design features have desirable CDs. The apparatus depicted in FIG. 3 forms an integration for forming the reticle 99 using E-beam lithography, projection printing, proximity printing, optical laser lithography, EUV, imprint lithography, combinations of the above or the like.

Figure 4:
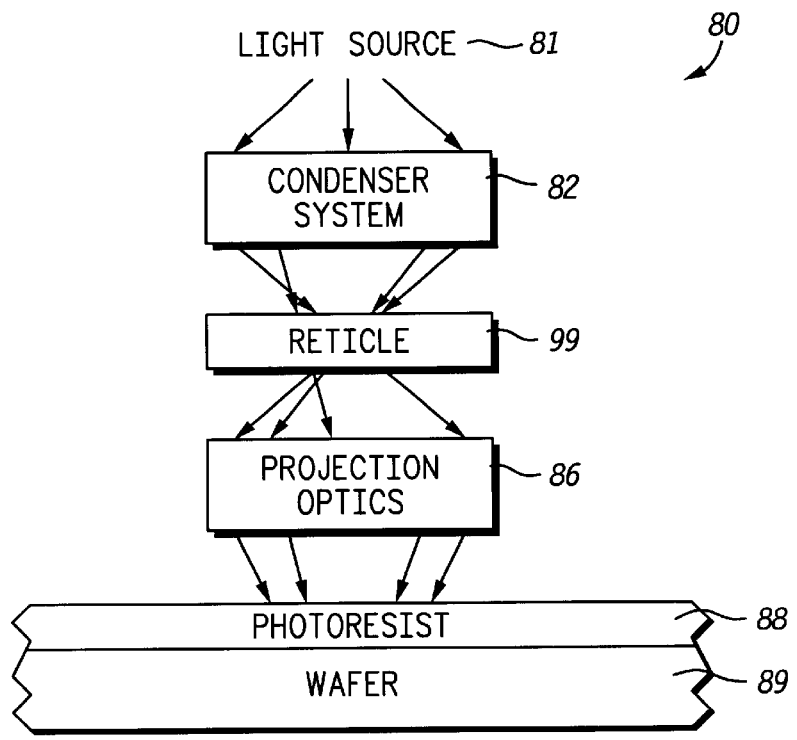
FIG. 4 illustrates a photolithographic apparatus to form a semiconductor device using the reticle of FIG. 3 in accordance with the present invention.

Shown in FIG. 4 is a photolithographic apparatus 80 which can be utilized in forming a semiconductor device on a semiconductor wafer 89 by exposing the reticle 99 made using reticle subresolution features 30. The photolithographic apparatus 80 comprises a light source 81, a condenser system 82, the reticle 99, projection optics 86, and the semiconductor wafer 89 having a photoresist layer 88 overlying it. The condenser system 82 receives light or an electron-beam (E-beam) generated from the light source 81 and applies it to all of the reticle 99 that has features to be applied to the semiconductor wafer 89. The reticle 84 then masks off portions of the light or E-beam received from the condenser system 82. The projection optics 86 then focuses the light or E-beam on the photoresist 88 so that the photoresist 88 is selectively exposed according to a pattern present on the reticle 99. Although the reticle 99 does not include any reticle subresolution features 30, the presence of reticle subresolution features 30 in design input 95 results in desired CDs of features in the reticle 99 and, hence, desired CDs of features on the semiconductor wafer 89. The apparatus depicted in FIG. 4 forms an integration for using the reticle 99 with phase-shift photolithography, OPC, E-beam lithography, optical lithography, deep ultraviolet optical lithography, extreme ultraviolet lithography (EUV), imprint lithography, projection printing, proximity printing, combinations of the above or the like.

The presence of reticle subresolution features 30 in the semiconductor device design results in improved control of CDs based on the presence and locations of the subresolution features by equalizing exposure, photoresist diffusion, and photoresist development effects. The improvement is seen both in short (on the order of 0.1 to 1 microns) and medium range (on the order of 10–1000 microns) CD control. The increased CD control allows for the use of optical reticle write tools, which are inexpensive and fast, but have poor CD control of small dimensions when compared to using other methods of forming reticles. It has been shown by the inventors that a three times improvement of CD control can be achieved using embodiments of the present invention. The improved CD control increases yield, circuit performance, and decreases cost.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for manufacturing a lithographic reticle for transferring an integrated circuit design to a semiconductor wafer, the method comprising the steps of:
   providing the integrated circuit design having a plurality of pattern features;
   locating areas of the integrated circuit design that have features relatively densely packed and areas of the design that are devoid of design features; and
   adding a plurality of subresolution design features to the areas of the design that are devoid of features, wherein a width of an area of the integrated circuit design that is devoid of design features is less than two times a width of one feature of the plurality of pattern features, and wherein the subresolution design features do not resolve on a lithographic reticle used to transfer the integrated circuit design to the semiconductor wafer.

2. The method of claim 1, wherein the method is implemented n software on a data processing system.

3. The method of claim 1, wherein the plurality of subresolution design features are for controlling critical dimensions of the plurality of pattern features on the lithographic reticle.

4. The method of claim 3, wherein the plurality of subresolution design features are for compensating for undesirable edge effects in the lithotgraphic reticle.

5. The method of claim 1, wherein a length of each of the plurality of subresolution design features is determined by the width of the area of the integrated circuit design devoid of design features.

6. A method for manufacturing a lithographic reticle for transferring an integrated circuit design to a semiconductor wafer, the method comprising the steps of:
   providing the integrated circuit design having a plurality of pattern features; and
   adding a plurality of subresolution design features to the integrated circuit design, wherein the plurality of subresolution design features a not resolve on the lithographic reticle used to transfer the integrated eke it design to the semiconductor wafer.

7. The method of claim 6, wherein the plurality of subresolution design features are for controlling critical dimensions of the plurality of pattern features.

8. The method of claim 6, wherein the method is implemented as software on a data processing system.

9. The method of claim 6, wherein a subresolution design feature of the plurality of subresolution design features is located a predetermined stance from an edge of a pattern feature of the plurality of pattern features, the subresolution design feature for compensating for proximity effects in the pattern feature.

10. The method of claim 9, wherein the subresolution design feature is for compensating for an asymmetry in a beam of an optical laser at an edge of a pattern feature.

11. The method of claim 6, wherein the plurality of subresolution design features are added to an area of the integrated circuit design that is devoid of design features, wherein a width of the area of the design devoid of design features is less than two times a width of one feature of the plurality of pattern features.

12. The method of claim 11, wherein the method is implemented as software on a data processing system.

13. The method of claim 12, wherein a length of each of the plurality of subresolution design features is determined by the width of the area of the design devoid of design features.

14. The method of claim 6, wherein the lithographic reticle is for a semiconductor masked lithography process selected from a group comprising deep ultra-violet light, X-ray, ion-beam, extreme ultra-violet light (EUV), imprint, and electron-beam (E-beam) lithography.

* * * * *

UNITED STATES PATENT AND TRADEMARK OFFICE
CERTIFICATE OF CORRECTION

PATENT NO. : 6,649,452 B2
DATED : November 18, 2003
INVENTOR(S) : Kevin D. Lucas, William L. Wilkinson and Cesar Garza It is certified that error appears in the above-identified patent and that said Letters Patent is hereby corrected as shown below:

Column 5,
Line 54, change "implemented n software" to -- implemented in software --

Column 6,
Line 19, change "features a not" to -- features do not --

Signed and Sealed this

Twenty-seventh Day of July, 2004

JON W. DUDAS
*Acting Director of the United States Patent and Trademark Office*